(12) United States Patent
Mohan et al.

(10) Patent No.: US 10,340,574 B2
(45) Date of Patent: Jul. 2, 2019

(54) SPATIAL COMBINING DEVICE AND ANTENNA

(71) Applicant: Qorvo US, Inc., Greensboro, NC (US)

(72) Inventors: Ankush Mohan, Thousand Oaks, CA (US); Dan Denninghoff, Thousand Oaks, CA (US); John Kitt, Ventura, CA (US); Soack Yoon, Torrance, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/845,225

(22) Filed: Dec. 18, 2017

(65) Prior Publication Data
US 2019/0067781 A1    Feb. 28, 2019

Related U.S. Application Data

(60) Provisional application No. 62/548,447, filed on Aug. 22, 2017, provisional application No. 62/548,448, (Continued)

(51) Int. Cl.
*H01P 5/12* (2006.01)
*H03F 3/195* (2006.01)
(Continued)

(52) U.S. Cl.
CPC ............... *H01P 5/12* (2013.01); *H01P 3/06* (2013.01); *H01Q 1/50* (2013.01); *H01Q 13/08* (2013.01);
(Continued)

(58) Field of Classification Search
CPC .. H01P 5/12; H01P 3/06; H01Q 13/08; H01Q 21/0025; H03F 3/195; H03F 2200/315; H03F 2200/451; H04B 7/0613
(Continued)

(56) References Cited

U.S. PATENT DOCUMENTS 4,234,854 A    11/1980  Schellenberg et al.
5,036,335 A    7/1991   Jairam
(Continued)

OTHER PUBLICATIONS

Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.
(Continued)

*Primary Examiner* — Lee Nguyen
(74) *Attorney, Agent, or Firm* — Withrow & Terranova, P.L.L.C.

(57) ABSTRACT

A spatial power-combining device and an antenna structure designed for high efficiency, high frequency, and ultra-wide bandwidth operation. The antenna structure may include a signal conductor and a ground conductor that are entirely separated by air. A spatial power-combining device may include a plurality of amplifier assemblies including multiple output antenna structures and an output coaxial waveguide section configured to concurrently combine signals received from each output antenna structure of the plurality of amplifier assemblies. The plurality of amplifier assemblies may also include multiple input antenna structures and an input coaxial waveguide configured to provide an input signal concurrently to each input antenna structure of the plurality of amplifier assemblies.

24 Claims, 9 Drawing Sheets

Related U.S. Application Data filed on Aug. 22, 2017, provisional application No. 62/548,457, filed on Aug. 22, 2017, provisional application No. 62/548,464, filed on Aug. 22, 2017, provisional application No. 62/548,472, filed on Aug. 22, 2017.

(51) Int. Cl.
| | |
|---|---|
| H01P 3/06 | (2006.01) |
| H01Q 1/50 | (2006.01) |
| H01Q 21/00 | (2006.01) |
| H01Q 13/08 | (2006.01) |
| H04B 7/06 | (2006.01) |
| H01P 5/16 | (2006.01) |

(52) U.S. Cl.
CPC ......... *H01Q 21/0025* (2013.01); *H03F 3/195* (2013.01); *H04B 7/0613* (2013.01); *H03F 2200/315* (2013.01); *H03F 2200/451* (2013.01)

(58) Field of Classification Search
USPC ........................................ 333/125, 135, 248
See application file for complete search history.

(56) References Cited

U.S. PATENT DOCUMENTS

| | | | |
|---|---|---|---|
| 5,214,394 | A | 5/1993 | Wong |
| 5,736,908 | A | 4/1998 | Alexanian et al. |
| 5,920,240 | A | 7/1999 | Alexanian et al. |
| 6,028,483 | A | 2/2000 | Shealy et al. |
| 6,037,840 | A | 3/2000 | Myer |
| 6,181,221 | B1 | 1/2001 | Kich et al. |
| 6,828,875 | B2 | 12/2004 | Channabasappa et al. |
| 7,110,165 | B2 | 9/2006 | Martin et al. |
| 7,215,220 | B1 | 5/2007 | Jia |
| 8,928,429 | B2 | 1/2015 | Song et al. |
| 9,019,036 | B2 | 4/2015 | Kolias et al. |
| 9,054,427 | B2 | 6/2015 | Guy et al. |
| 9,065,163 | B1 | 6/2015 | Wu et al. |
| 9,276,304 | B2 | 3/2016 | Behan et al. |
| 9,287,605 | B2 | 3/2016 | Daughenbaugh, Jr. et al. |
| 9,293,801 | B2 * | 3/2016 | Courtney ................ H01Q 9/28 |
| 9,917,343 | B2 | 3/2018 | Chieh et al. |
| 9,954,706 | B1 | 4/2018 | Harris et al. |
| 10,009,067 | B2 | 6/2018 | Birk et al. |
| 2014/0145794 | A1 | 5/2014 | Courtney et al. |
| 2014/0167880 | A1 | 6/2014 | Daughenbaugh, Jr. et al. |
| 2017/0149113 | A1 | 5/2017 | Theveneau et al. |
| 2017/0179598 | A1 | 6/2017 | Kitt |

OTHER PUBLICATIONS

Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.

Courtney, Patrick G. et al., "120 W Ka Band Power Amplifier Utilizing GaN MMICs and Coaxial Waveguide Spatial Power Combining," White Paper, May 2016, Qorvo, pp. 1-8.

Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.

Leggieri, Alberto et al., "The Squarax Spatial Power Combiner," Progress in Electromagnetics Research C, vol. 45, Oct. 2013, EMW Publishing, pp. 43-55.

Ortiz, Sean C., "High Power Spatial Combiners: Tile and Tray Approaches," Dissertation, North Carolina State University, Electrical Engineering, Nov. 2001, 194 pages.

Notice of Allowance for U.S. Appl. No. 15/290,749, dated Feb. 16, 2018, 9 pages.

Montgomery, R., et al., "Solid-State PAs Bathe TWTAs for ECM Systems," Microwave Journal, Jun. 2017 Supplement, Jun. 14, 2017, 3 pages.

Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.

Non-Final Office Action for U.S. Appl. No. 15/637,472, dated Aug. 10, 2018, 8 pages.

Notice of Allowance for U.S. Appl. No. 15/927,565, dated Aug. 8, 2018, 8 pages.

Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.

Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.

Fathy, A, et al., "A Simplified Approach for Radial Power Combiners," IEEE Transactions on Microwave Theory and Techniques, vol. 54, No. 1, Jan. 2006, pp. 247-255.

Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.

Tribak, A., et al., "Ultra-Broadband High Efficiency Mode Converter," Progress in Electromagnetics Research C, vol. 36, 2013, pp. 145-158.

Notice of Allowance for U.S. Appl. No. 16/166,548, dated Nov. 29, 2018, 8 pages.

Notice of Allowance for U.S. Appl. No. 15/637,472, dated Mar. 12, 2019, 7 pages.

Non-Final Office Action for U.S. Appl. No. 15/846,840, dated Mar. 21, 2019, 4 pages.

Non-Final Office Action for U.S. Appl. No. 15/933,783, dated May 1, 2019, 8 pages.

* cited by examiner

SPATIAL COMBINING DEVICE AND ANTENNA

This application claims the benefit of U.S. provisional patent application Ser. Nos. 62/548,447, 62/548,448, 62/548,457, 62/548,464, and 62/548,472, all of which were filed on Aug. 22, 2017, the disclosures of which are incorporated herein by reference in their entireties.

FIELD OF THE DISCLOSURE

The disclosure relates generally to an amplifier assembly and, more particularly, to an amplifier assembly and antenna structure for a power-combining device.

BACKGROUND

Spatial power-combining devices, such as a Qorvo® Spatium® spatial power-combining device, are used for broadband radio frequency power amplification in commercial and defense communications, radar, electronic warfare, satellite, and various other communication systems. Spatial power-combining techniques are implemented by combining broadband signals from a number of amplifiers to provide output powers with high efficiencies and operating frequencies. One example of a spatial power-combining device utilizes a plurality of solid-state amplifier assemblies that form a coaxial waveguide to amplify an electromagnetic signal. Each amplifier assembly may include an input antenna structure, an amplifier, and an output antenna. When the amplifier assemblies are combined to form the coaxial waveguide, the input antennas may form an input antipodal antenna array, and the output antennas may form an output antipodal antenna array.

In operation, an electromagnetic signal is passed through an input port to an input coaxial waveguide section of the spatial power-combining device. The input coaxial waveguide section distributes the electromagnetic signal to be split across the input antipodal antenna array. The amplifiers receive the split signals and in turn transmit amplified split signals across the output antipodal antenna array. The output antipodal antenna array and output coaxial waveguide section combine the amplified split signals to form an amplified electromagnetic signal that is passed to an output port of the spatial power-combining device.

The antenna for conventional spatial power-combining devices typically includes a metal antenna signal conductor and a metal antenna ground conductor deposited on opposite sides of a substrate, such as a printed circuit board. The printed circuit board provides the desired form factor and mechanical support for the antenna signal conductor and the antenna ground conductor; however, a printed circuit board can become increasingly lossy at higher frequencies, thereby limiting the combining efficiency and achievable output power of the antenna.

SUMMARY

The present disclosure relates to spatial power-combining devices and in particular to spatial power-combining devices with antenna structures that have a ground conductor and a signal conductor that are completely separated by air.

In some embodiments, a spatial power-combining device for modifying a signal is provided. The spatial power-combining device includes a plurality of amplifier assemblies. Each amplifier assembly includes an amplifier, an output antenna structure having an output ground conductor and an output signal conductor that are entirely separated by air. The amplifier assembly includes a transmission line connected between the amplifier and the output signal conductor, and an output waveguide configured to combine signals received from the output antenna of each amplifier assembly.

In other embodiments, a device for modifying a signal is provided. The device includes an amplifier assembly that includes an amplifier, an input antenna structure having an input ground conductor, and an input signal conductor that are entirely separated by air. The amplifier assembly also includes an output antenna structure having an output ground conductor and an output signal conductor that are entirely separated by air. The amplifier assembly includes a first transmission line connected between the amplifier and the input signal conductor and a second transmission line connected between the amplifier and the output signal conductor.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although ordinals, such as "first," "second," etc. may be used herein to describe various elements, these elements are not limited by these terms. Such ordinals are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

The disclosure relates to spatial power-combining devices and in particular to spatial power-combining devices with antenna structures designed for high efficiency, high frequency, and ultra-wide bandwidth operation. Some embodiments relate to a device for modifying a signal with an antenna structure designed for high efficiency, high frequency, and ultra-wide bandwidth operation.

In some embodiments, the antenna structure may include a signal conductor and a ground conductor that are entirely separated by air. Conventional antenna structures for spatial power-combining devices typically have antenna conductors in the form of patterned metals on opposing sides of a printed circuit board. Separating the antenna conductors entirely by air eliminates any lossy materials of the printed circuit board and, among other advantages, facilitates spatial power-combining devices with antenna structures sized for ultra-broadband microwave operation. The embodiments are particularly adapted to spatial power-combining devices that operate at microwave frequencies, such as, by way of non-limiting example, energy between about 300 MHz (100 cm wavelength) and 300 GHz (0.1 cm wavelength). Additionally, embodiments may comprise operating frequency ranges that extend above microwave frequencies. In some embodiments, by way of non-limiting examples, the operating frequency range includes frequencies of 40 GHz and higher, such as operating frequency ranges of 2 GHz to 400 GHz, 20 GHz to 120 GHz, and 70 GHz to 400 GHz. Accordingly, an amplifier assembly as described herein may be configured to transmit electromagnetic signals in a microwave frequency range and higher. For example, an amplifier assembly may transmit electromagnetic signals in a frequency range that includes a frequency between 40 GHz and 400 GHz.

A spatial power-combining device generally includes a plurality of individual signal paths that may be referred to as a plurality of amplifier assemblies, with each amplifier assembly comprising an amplifier connected to an output antenna structure by a transmission line. The output antenna structure may comprise an output ground conductor and an output signal conductor that are entirely separated by air. An output coaxial waveguide may be configured to concurrently combine the amplified signals from each output antenna. Each amplifier assembly may further comprise an input antenna structure in which each input antenna structure comprises an input ground conductor and an input signal conductor that are entirely separated by air. An input coaxial waveguide may be configured to provide a signal concurrently to each input antenna structure. The plurality of amplifier assemblies may be arranged coaxially about a center axis. Accordingly, the spatial power-combining device may be configured to split, amplify, and combine an electromagnetic signal.

Figure 1:
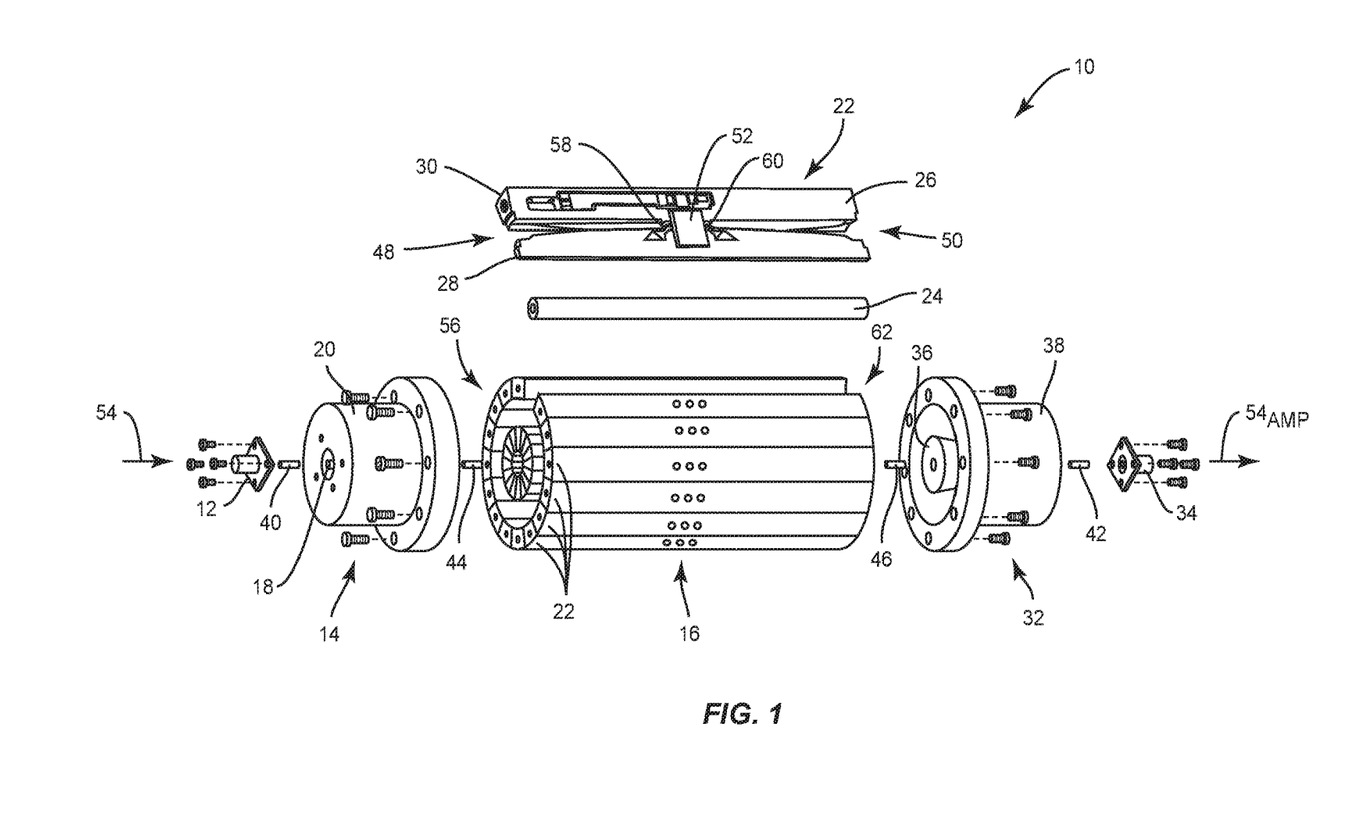
FIG. 1 is a perspective view of a spatial power-combining device according to some embodiments.

FIG. 1 is a perspective view of a representative spatial power-combining device 10 according to some embodiments. The spatial power-combining device 10 includes an input port 12 and an input coaxial waveguide section 14. The input coaxial waveguide section 14 provides a broadband transition from the input port 12 to a center waveguide section 16. Electrically, the input coaxial waveguide section 14 provides broadband impedance matching from an impedance $Z_{p1}$ of the input port 12 to an impedance $Z_c$ of the center waveguide section 16. Outer surfaces of an inner conductor 18 and an inner surface of an outer conductor 20 have gradually changed profiles configured to minimize the impedance mismatch from the input port 12 to the center waveguide section 16.

The center waveguide section 16 comprises a plurality of amplifier assemblies 22, and a cylinder post 24 that has a major longitudinal axis that is coincident with a central longitudinal axis of the center waveguide section 16. The plurality of amplifier assemblies 22 may be positioned circumferentially around the post 24. Each amplifier assembly 22 includes a body 26 having a predetermined wedge-shaped cross-section, an inner surface 28, and an arcuate outer surface 30. When the amplifier assemblies 22 are assembled together, they form a cylinder with a cylindrical central cavity, defined by the inner surfaces 28, which accommodates the post 24.

The spatial power-combining device 10 also includes an output coaxial waveguide section 32 and an output port 34. The input port 12 and the output port 34 may be field-replaceable Subminiature A (SMA) connectors. In other embodiments, the input port 12 and the output port 34 may be super SMA connectors, type N connectors, K connectors, or any other suitable connectors. The output coaxial waveguide section 32 provides a broadband transition from the center waveguide section 16 to the output port 34. Electrically, the output coaxial waveguide section 32 provides broadband impedance matching from the impedance 4 of the center waveguide section 16 to an impedance $Z_{p2}$ of the output port 34. The outer surfaces of an inner conductor 36 and the inner surface of an outer conductor 38 have gradually changed profiles configured to minimize the impedance mismatch from the output port 34 to the center waveguide section 16. Pin 40 connects between the input port 12 and the input coaxial waveguide section 14, and pin 42 connects between output port 34 and output coaxial waveguide section 32. The post 24 connects with the inner conductors 18, 36 by way of screws 44, 46 on opposite ends of the post 24. The post 24 is provided for simplifying mechanical connections, may have other than a cylindrical shape, and may be omitted altogether.

Each amplifier assembly 22 includes an input antenna structure 48, an output antenna structure 50, and an amplifier 52. In some embodiments, the amplifier 52 comprises a monolithic microwave integrated circuit (MMIC) amplifier. The MMIC may be a solid-state gallium nitride (GaN)-based MMIC. A GaN MMIC device provides high power density and bandwidth, and a spatial power-combining device may combine power from a plurality of GaN MMICs efficiently in a single step to minimize combining loss.

Accordingly, the input coaxial waveguide section 14 is electrically coupled to the plurality of amplifier assemblies 22 at each input antenna structure 48, and the input coaxial waveguide section 14 is configured to provide an input signal 54 concurrently to each input antenna structure 48. In a similar manner, the output coaxial waveguide section 32 is electrically coupled to the plurality of amplifier assemblies 22 at each output antenna structure 50, and the output coaxial waveguide section 32 is configured to concurrently combine signals received from each output antenna structure 50.

In operation, an input signal 54 is presented to the input port 12. The input antenna structures 48 of the plurality of amplifier assemblies 22 collectively form an input antenna array 56. The input antenna array 56 couples the input signal 54 from the input coaxial waveguide section 14, distributing the input signal 54 substantially evenly to each one of the amplifier assemblies 22. Each input antenna structure 48 receives a signal portion of the input signal 54 and communicates the signal portion via a first connector 58 to the amplifier 52. The amplifier 52 amplifies the portion of the input signal 54 to generate an amplified signal portion. Each amplifier 52 transmits the amplified signal portion via the second connector 60 and the output antenna structure 50. The plurality of output antenna structures 50 forms an output antenna array 62 that operates to combine the amplified signal portions inside the opening of the output coaxial waveguide section 32 to form an amplified output signal $54_{AMP}$, which is then propagated through the output coaxial waveguide section 32 to the output port 34.

Figure 2A:
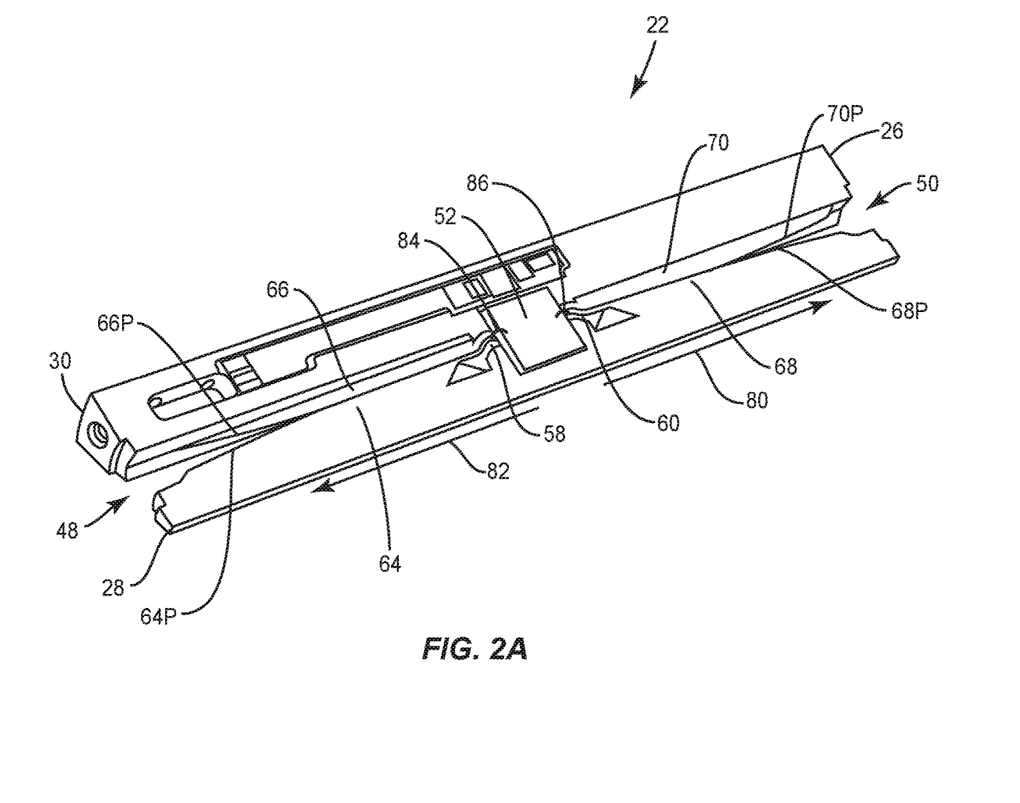
FIG. 2A is a perspective view of an amplifier assembly according to some embodiments.

FIG. 2A is an enlarged perspective view of an amplifier assembly 22 of FIG. 1. The input antenna structure 48 comprises an input signal conductor 64 and an input ground conductor 66 that are entirely separated by air, and the output antenna structure 50 comprises an output signal conductor 68 and an output ground conductor 70 that are entirely separated by air. This may be accomplished by forming the input antenna structure 48 and the output antenna structure 50 out of metal through standard machining practices such that the metal is thick enough to not require a supporting substrate. Accordingly, the printed circuit board supporting antennas in conventional spatial power-combining amplifiers is eliminated.

Accordingly, a spatial power-combining device 10 is provided for modifying a signal 54, the spatial power-combining device 10 comprising a plurality of amplifier assemblies 22, wherein each amplifier assembly 22 comprises an amplifier 52, an output antenna structure 50 comprising an output ground conductor 70 and an output signal conductor 68 that are entirely separated by air, a second transmission line 86 connected between the amplifier 52 and the output signal conductor 68, and an output waveguide 32 configured to combine signals 54 received from the output antenna structure 50 of each amplifier assembly 22.

Additionally, the output ground conductor 70 comprises a first profile 70P, and the output signal conductor 68 comprises a second profile 68P, wherein the first profile 70P and the second profile 68P diverge from one another in a first direction 80 away from the amplifier 52. In a similar manner the input ground conductor 66 comprises a third profile 66P, and the input signal conductor 64 comprise a fourth profile 64P, wherein the third profile 66P and the fourth profile 64P diverge from one another in a second direction 82 away from the amplifier 52. As shown in FIG. 2A, the first profile 70P and the second profile 68P diverge from one another in a continuous manner, and the third profile 66P and the fourth profile 64P diverge from one another in a continuous manner. However, other profiles are possible.

In some embodiments, the first connector 58 is a single piece or is integral with the input signal conductor 64, and the second connector 60 is a single piece or is integral with the output signal conductor 68. In other embodiments, the first connector 58 and second connector 60 may be separate elements that are part of an electrical path with the amplifier 52. A first transmission line 84 is connected between the amplifier 52 and the input signal conductor 64, and a second transmission line 86 is connected between the amplifier 52 and the output signal conductor 68. The first transmission line 84 and second transmission line 86 may comprise any form of electrical connector, such as, but not limited to, wires or wire bonds.

Figure 2B:
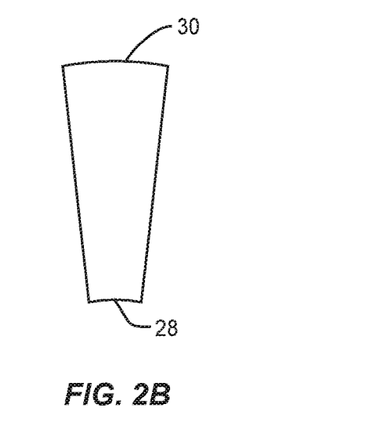
FIG. 2B is a cross-sectional view of an amplifier assembly according to some embodiments.

The amplifier assembly 22 may generally have a wedge-shaped cross-section as represented in FIG. 2B that accommodates the cylindrical center waveguide section 16 of FIG. 1. However, in other embodiments, the amplifier assembly 22 may be configured to form a center waveguide section 16 with different cross-sectional shapes, such as rectangular, oval, or other geometric shapes.

Figure 3A:
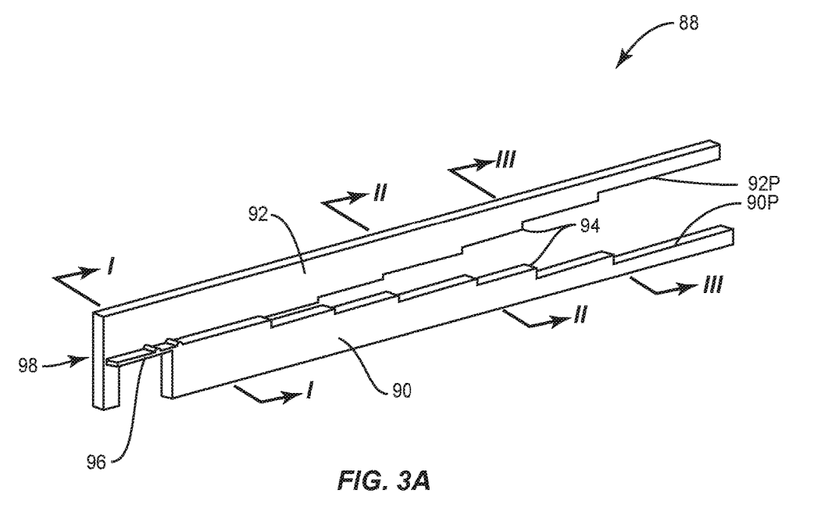
FIG. 3A is a perspective view of an antenna structure according to some embodiments.

FIG. 3A is a perspective view of an antenna structure 88 according to some embodiments. The antenna structure 88 includes a signal conductor 90 with a first profile 90P and a ground conductor 92 with a second profile 92P that diverge away from each other along parallel planes in a lengthwise direction. The signal conductor 90 and the ground conductor 92 may additionally include tuning features 94 configured for a desired operating frequency and an operating bandwidth. In FIG. 3A, tuning features 94 are configured in a continuously decreasing stepwise manner as the signal conductor 90 and ground conductor 92 diverge away from each other. Accordingly, the first profile 90P and the second profile 92P may diverge from one another in a stepwise manner. However, many different profiles are possible depending on the desired frequency and bandwidth operation. For example, tuning features 94 may be steps that increase and decrease at various points along the first profile 90P and the second profile 92P. Additionally, the first profile 90P and the second profile 92P may diverge from one another in a continuous manner without steps as shown by example in FIG. 2A.

As in previous embodiments, the signal conductor 90 may additionally include a connector 96 for receiving a signal. The connector 96 may be a single piece or integral with the signal conductor 90, or it may be formed separately. The connector 96 is a transition area for the antenna structure 88 to transmit or receive a signal, such as a signal with frequency in the microwave range or higher. The antenna structure 88 may comprise a metal with a thickness such that a substrate is not required for support, thereby an air gap 98 is maintained entirely between the signal conductor 90 and the ground conductor 92. Accordingly, the signal conductor 90 and the ground conductor 92 are entirely separated by air.

Figure 3B:
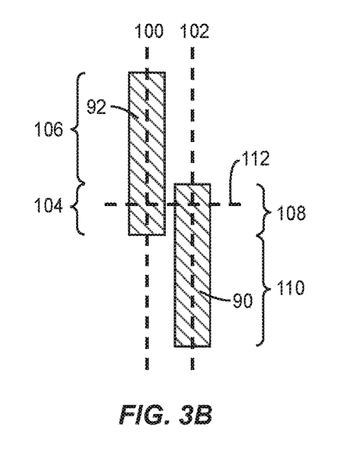
FIG. 3B is a cross-sectional view of the antenna of FIG. 3A.
Figure 3C:
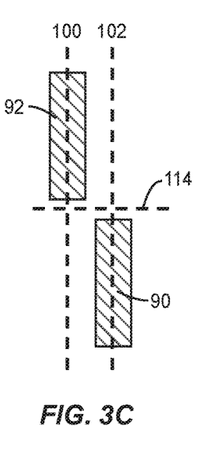
FIG. 3C is a cross-sectional view of the antenna of FIG. 3A.
Figure 3D:
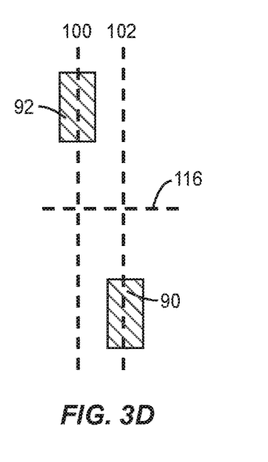
FIG. 3D is a cross-sectional view of the antenna of FIG. 3A.

FIGS. 3B, 3C, and 3D represent various cross-sections taken along section lines I-I, II-II, and III-III, respectively, of the antenna structure 88 of FIG. 3A in which the ground conductor 92 and the signal conductor 90 diverge away from each other along a lengthwise direction. As shown, the ground conductor 92 is a planar structure positioned in a first plane 100, and the signal conductor 90 is a planar structure positioned in a second plane 102, and the first plane 100 is parallel to the second plane 102. The ground conductor 92 comprises a ground conductor overlapping portion 104 and a ground conductor non-overlapping portion 106, and the signal conductor 90 comprises a signal conductor overlapping portion 108 and a signal conductor non-overlapping portion 110. In FIG. 3B, a first line 112 perpendicular to the first plane 100 intersects the ground conductor overlapping portion 104 and the signal conductor overlapping portion 108. As the ground conductor 92 and signal conductor 90 diverge away from each other along a lengthwise direction of the antenna structure, there are cross-sections where no line perpendicular to first plane 100 intersects any portion of both the ground conductor 92 and the signal conductor 90. For example, in the cross-sections of FIGS. 3C and 3D, the perpendicular lines 114 and 116, respectively, represent the closest perpendicular lines to both the ground conductor 92 and the signal conductor 90.

It is understood that the antenna structure 88 of FIGS. 3A to 3D may be configured to be an input antenna structure or an output antenna structure as described in previous embodiments. Accordingly, the ground conductor 92 may be configured as an input ground conductor with an input ground conductor overlapping portion and an input ground conductor non-overlapping portion or an output ground conductor with an output ground conductor overlapping portion and an output ground conductor non-overlapping portion. The signal conductor 90 may be configured as an input signal conductor with an input signal conductor overlapping portion and an input signal conductor non-overlapping portion or an output signal conductor with an output signal conductor overlapping portion and an output signal conductor non-overlapping portion.

Figure 4:
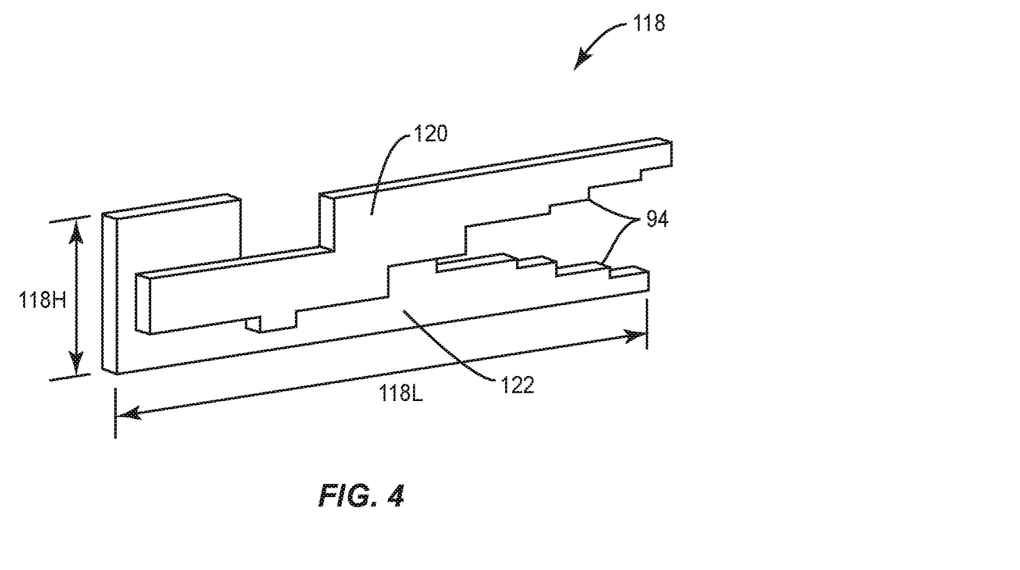
FIG. 4 is a perspective view of an antenna according to some embodiments.
Figure 5:
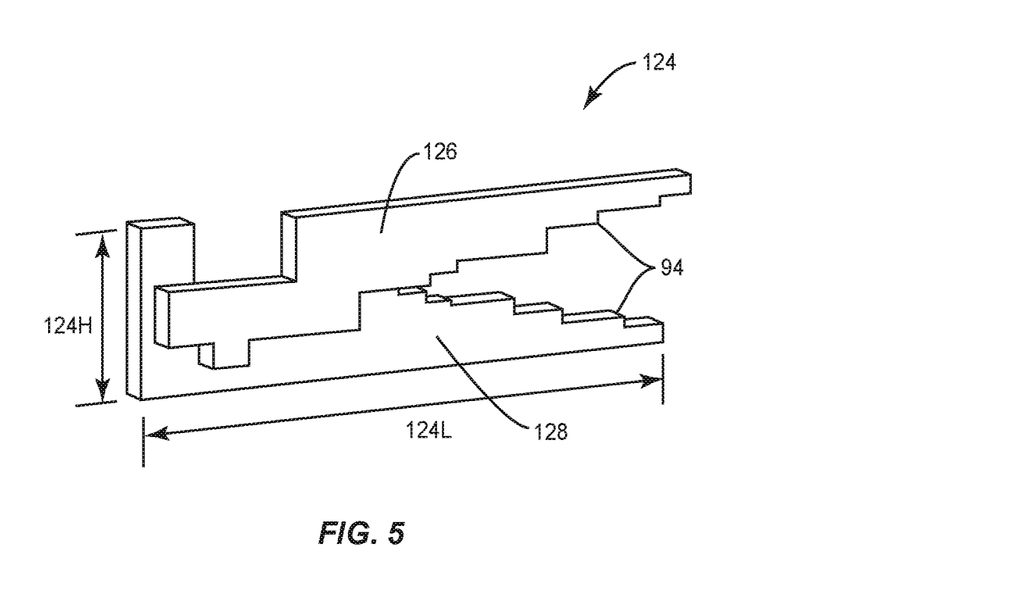
FIG. 5 is a perspective view of an antenna according to some embodiments.
Figure 6:
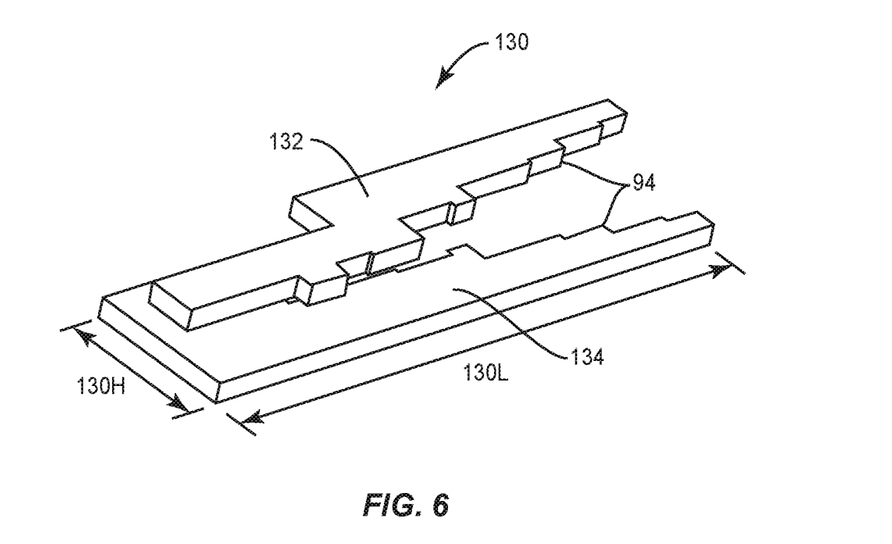
FIG. 6 is a perspective view of an antenna according to some embodiments.

Designing an antenna in which a conventional substrate is removed and the signal and ground conductors are separated entirely by air provides the ability to scale down designs for higher frequency ranges not previously attainable. For example, the antenna structure 118 of FIG. 4 comprises a signal conductor 120, a ground conductor 122, and tuning features 94 that are scaled to provide an operating range of 20-120 GHz. For example, antenna structure 118 may have length 118L of about 6-7 mm and a height 118H of about 1-2 mm. In FIG. 5, the antenna structure 124 comprises a signal conductor 126, a ground conductor 128, and tuning features 94 that are scaled down further to provide an operating range of 70-400 GHz. For example, antenna structure 124 may have length 124L of about 1-2 mm and a height 124H of about 0.3-0.6 mm. In both designs, the impedance along the antenna structure may transform from 50 ohms to 375 ohms. While this scalability is advantageous for high-frequency designs, it is also applicable for lower frequency applications. For example, the antenna structure 130 of FIG. 6 comprises a signal conductor 132, a ground conductor 134, and tuning features 94 that are larger than those in FIGS. 4 and 5 and may be configured for operation below 1 GHz. For example, the antenna structure 130 may have length 130L of about 610-640 mm and a height 130H of about 150-160 mm. It is understood that the antenna structures 118, 124, and 130 of FIGS. 4, 5, and 6, respectively, may be configured to be an input antenna structure or an output antenna structure as described in previous embodiments. Accordingly, an output antenna structure or an input antenna structure may be configured to transmit electromagnetic signals in a frequency range that includes a frequency between 40 GHz and 400 GHz.

Figure 7:
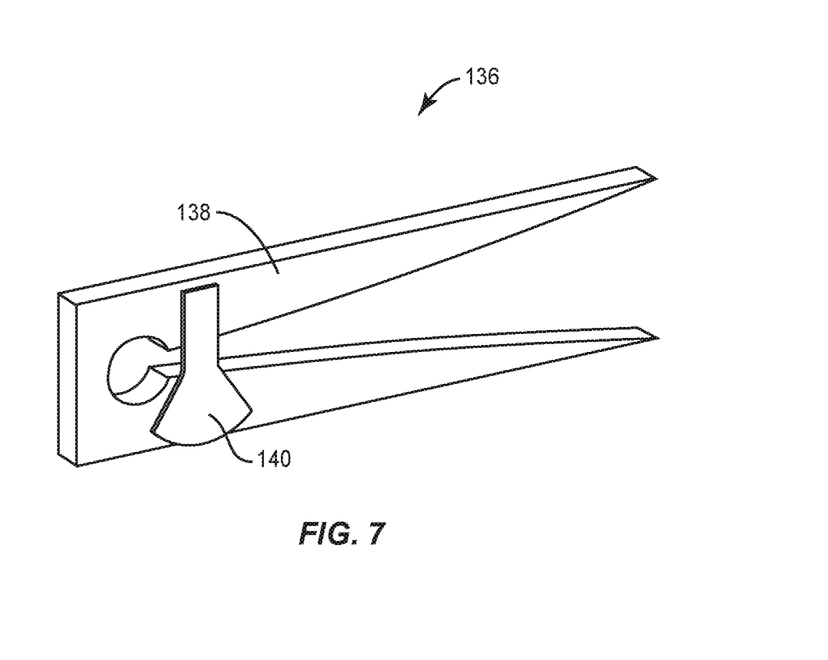
FIG. 7 is a perspective view of an antenna according to some embodiments.

Additional antenna designs are possible, such as a stub-launch antenna design, as shown by the antenna structure 136 of FIG. 7. The antenna structure 136 comprises ground conductor 138 and a signal conductor 140 that are entirely separate by air. Antenna structure 136 is configured of metal thick enough so that a supporting substrate such as a printed circuit board is not required. Accordingly, the antenna structure 136 is a Vivaldi antenna that is free of printed circuit board materials.

Figure 8A:
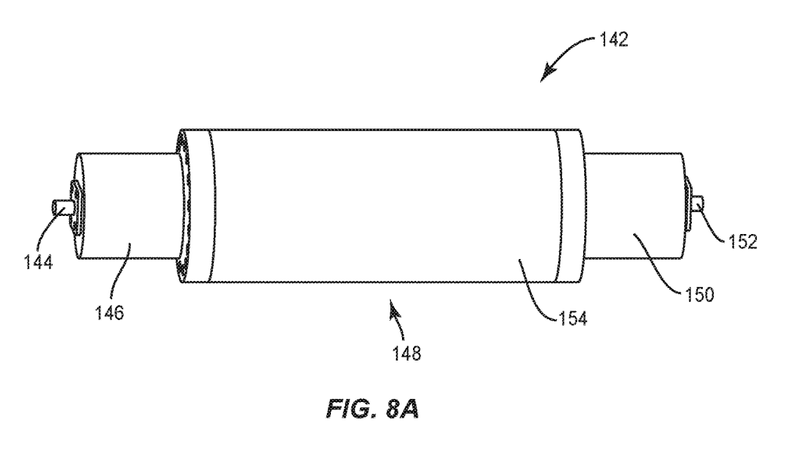
FIG. 8A is a perspective view of a spatial power-combining device according to some embodiments.

FIGS. 8A to 8F depict a representative spatial power-combining device 142 according to some embodiments. In FIG. 8A, the spatial power-combining device 142 includes an input port 144, an input coaxial waveguide section 146, a center waveguide section 148, an output coaxial waveguide section 150, and an output port 152 as previously described. The spatial power-combining device also comprises a center waveguide cover 154. The center waveguide cover 154 is removed in FIG. 8B to show an input center waveguide section 156, an amplifier array 158 radially arranged, and an output center waveguide section 160. In some embodiments, the amplifier array 158 comprises an array of monolithic microwave integrated circuit (MMIC) amplifiers. In some embodiments, the MMIC may be a solid-state gallium nitride (GaN)-based MMIC. A GaN MMIC device provides high power density and bandwidth, and a spatial power-combining device may combine power from an array of GaN MMICs efficiently in a single step to minimize combining loss.

Figure 8B:
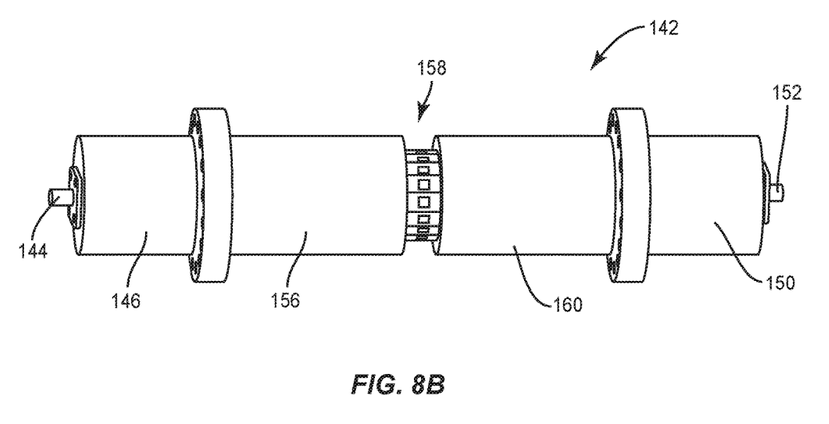
FIG. 8B is a perspective view of a spatial power-combining device according to some embodiments.

As previously described, a spatial power-combining device 142 may include a plurality of input antennas configured to concurrently receive a split signal, such as a microwave signal or a signal with higher frequencies, to be amplified and a plurality of output antennas arranged to concurrently combine the amplified signals. In the embodiment, the plurality of input antennas, which may also be referred to as an input antipodal antenna array, are included in the input center waveguide section 156; and the plurality of output antennas, which may also be referred to as an output antipodal antenna array, are included in the output center waveguide section 160 on opposing sides of the amplifier array 158. As previously described, each input antenna comprises an input signal conductor and an input ground conductor, and each output antenna comprises an output signal conductor and an output ground conductor.

Figure 8C:
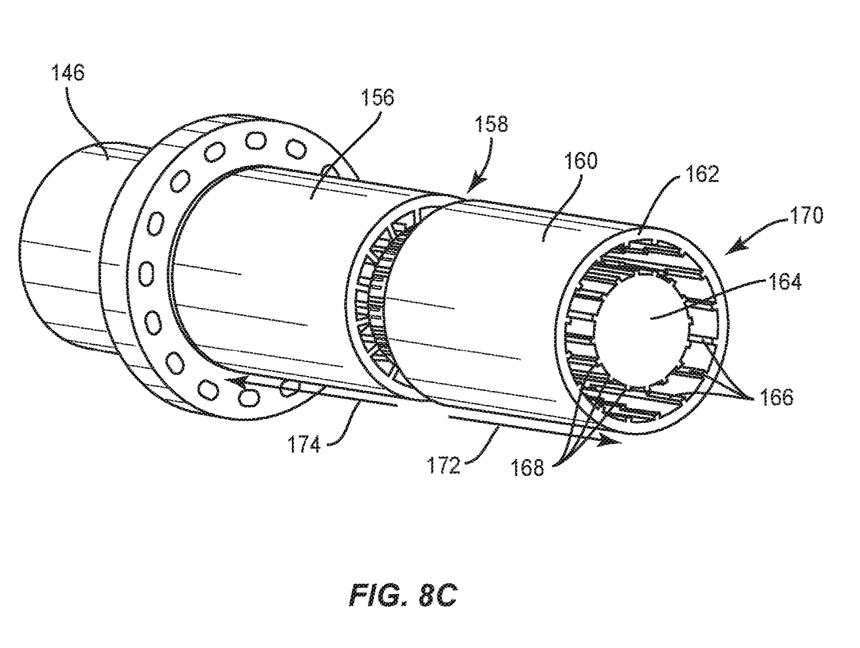
FIG. 8C is a perspective view of a spatial power-combining device according to some embodiments.
Figure 8D:
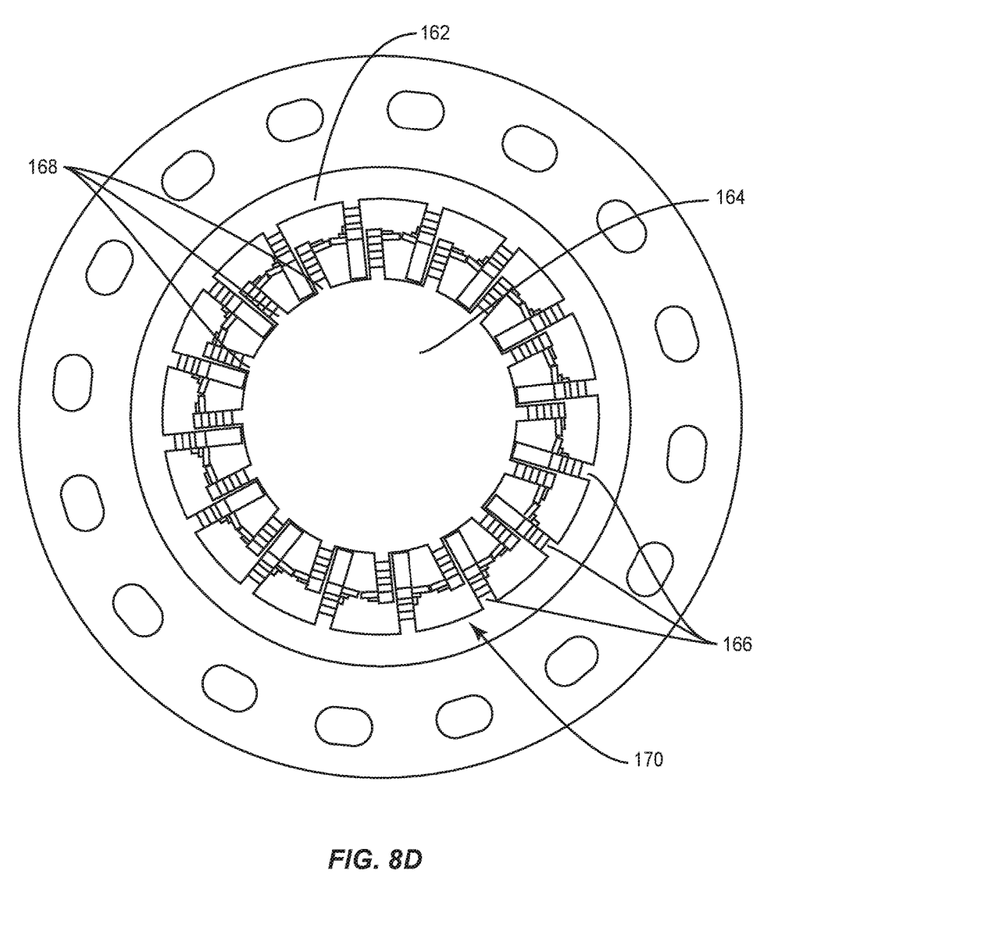
FIG. 8D is a perspective view of a spatial power-combining device according to some embodiments.

In FIGS. 8C and 8D, the output coaxial waveguide section 150 and output port 152 of FIG. 8B are removed to show details of the output center waveguide section 160. The output center waveguide section 160 comprises an outer housing 162 and an inner housing 164. The outer housing 162 comprises each output ground conductor 166, and the inner housing 164 comprises each output signal conductor 168. Individual pairs of an output ground conductor 166 and an output signal conductor 168 together form individual antennas of an output antipodal antenna array 170 and mechanically supporting them to the outer housing 162 and the inner housing 164 allows each pair of output ground conductor 166 and an output signal conductor 168 to be entirely separated by air. As with previous embodiments, the output ground conductor 166 and an output signal conductor 168 diverge away from each other in a direction 172 opposite the amplifier array 158. In some embodiments, the output ground conductors 166 and the outer housing 162 are an integral single component, and the output signal conductors 168 and the inner housing 164 are an integral single component. In other embodiments, the output ground conductors 166 and output signal conductors 168 may be formed separately and attached to the outer housing 162 and inner housing 164, respectively. In other embodiments, the order may be reversed in which the output signal conductors 168 are mechanically supported by outer housing 162 and output ground conductors 166 are mechanically supported by inner housing 164. While FIGS. 8C and 8D represent details of the output center waveguide section 160, it is understood the details of the input center waveguide section 156 would be the same as the output center waveguide section 160 extending in the opposite direction 174 from the amplifier array 158 and the terms would be renamed input instead of output.

Figure 8E:
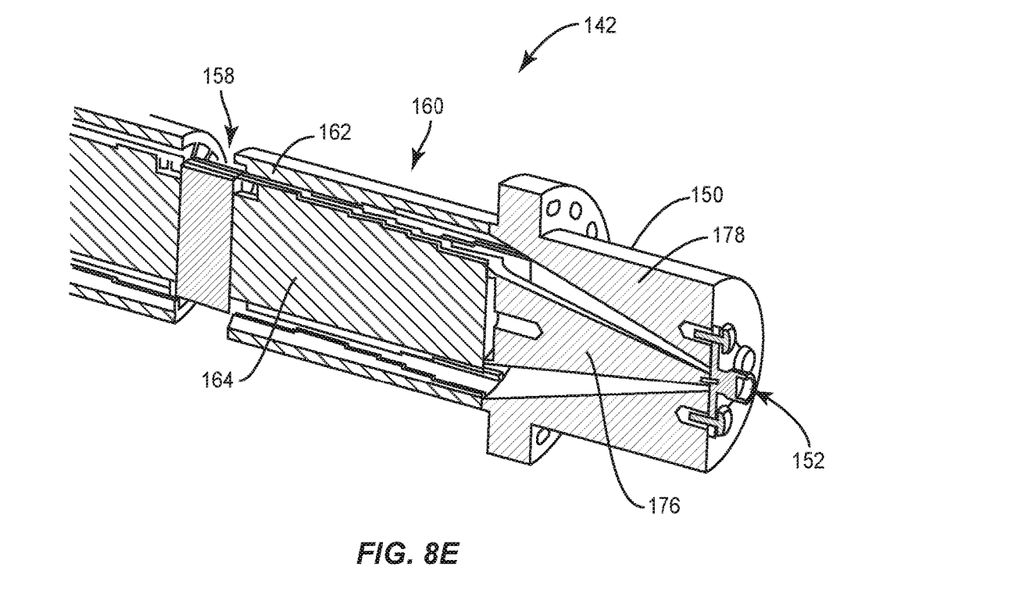
FIG. 8E is a cross-sectional view of a spatial power-combining device according to some embodiments.
Figure 8F:
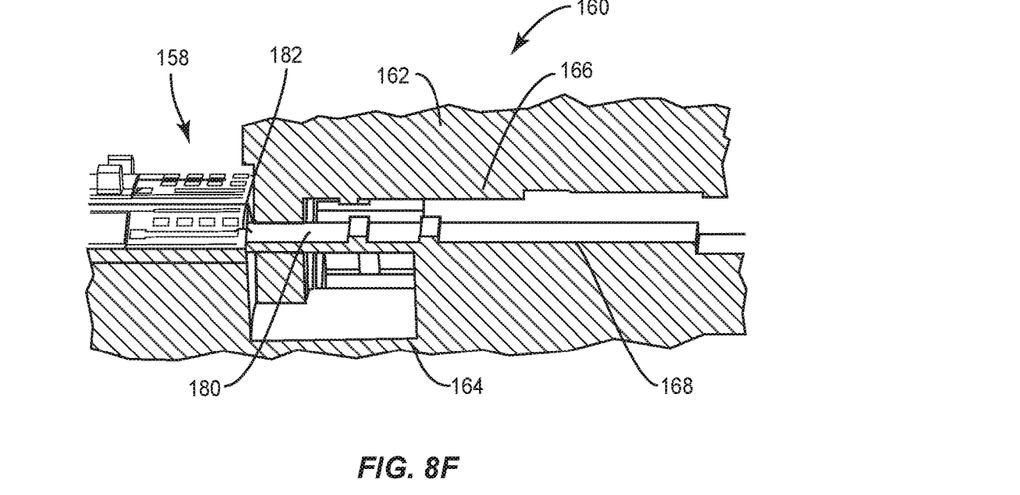
FIG. 8F illustrates a portion of the spatial power-combining device of FIG. 8E in greater detail.

FIG. 8E represents a cross-section view of the spatial power-combining device 142 including details of the output coaxial waveguide section 150 and output port 152. The output coaxial waveguide section 150 comprises an inner conductor 176 and an outer conductor 178 with gradually changing profiles configured to reduce impedance mismatch from the output port 152 and the output center waveguide section 160. FIG. 8F is a close-up view of the transition between output center waveguide section 160 and amplifier array 158. Output signal conductor 168 comprises a connector 180 for making an electrical connection 182 to amplifier array 158. Electrical connection 182 may be a transmission line comprising a wire, a wire bond, or any other component that functions to transition energy from the planar medium of the amplifier array 158 to the orthogonal direction of the output signal conductor 168 and the output ground conductor 166. As before, it is understood that the details of the input side of the device are the same as those of the output side extending in a direction opposite the amplifier array 158. Accordingly, a second transmission line may connect between an input signal conductor and the amplifier array 158.

Those skilled in the art will recognize improvements and modifications to the preferred embodiments of the present disclosure. All such improvements and modifications are considered within the scope of the concepts disclosed herein and the claims that follow.

What is claimed is:

1. A spatial power-combining device for modifying a signal, the spatial power-combining device comprising:
    a plurality of amplifier assemblies, wherein each amplifier assembly comprises:
        an amplifier;
        an output antenna structure comprising an output ground conductor and an output signal conductor that are entirely separated by air;
        a transmission line connected between the amplifier and the output signal conductor; and
    an output waveguide configured to combine signals received from the output antenna of each amplifier assembly.

2. The spatial power-combining device of claim 1 wherein the amplifier is a monolithic integrated circuit (MMIC) amplifier.

3. The spatial power-combining device of claim 1 wherein the output antenna structure is configured to transmit amplified electromagnetic signals in a frequency range that includes a frequency between 40 GHz and 400 GHz.

4. The spatial power-combining device of claim 1 wherein each amplifier assembly further comprises an input antenna structure, each input antenna structure comprising an input ground conductor and an input signal conductor that are entirely separated by air.

5. The spatial power-combining device of claim 4 further comprising an input coaxial waveguide section configured to concurrently provide a signal to each input antenna structure of the plurality of amplifier assemblies.

6. The spatial power-combining device of claim 5 wherein the plurality of amplifier assemblies are arranged coaxially about a center axis.

7. The spatial power-combining device of claim 6, further comprising:
    an input coaxial waveguide section electrically coupled to the plurality of amplifier assemblies at each input antenna structure, the input coaxial waveguide section configured to provide an input signal concurrently to each input antenna structure of the plurality of amplifier assemblies; and
    an output coaxial waveguide section electrically coupled to the plurality of amplifier assemblies at each output antenna structure, the output coaxial waveguide section configured to concurrently combine signals received from each output antenna structure of the plurality of amplifier assemblies.

8. The spatial power-combining device of claim 4 wherein the output ground conductor comprises a first profile and the output signal conductor comprises a second profile wherein the first profile and the second profile diverge from one another in a first direction.

9. The spatial power-combining device of claim 8 wherein the input ground conductor comprises a third profile and the input signal conductor comprise a fourth profile wherein the third profile and the fourth profile diverge from one another in a second direction.

10. The spatial power-combining device of claim 9 wherein the third profile and the fourth profile diverge from one another in one of a continuous manner or a stepwise manner.

11. The spatial power-combining device of claim 8 wherein the first profile and the second profile diverge from one another in one of a continuous manner or a stepwise manner.

12. The spatial power-combining device of claim 1 wherein the output antenna structure is a stub-launch antenna.

13. The spatial power-combining device of claim 1 wherein the output antenna structure comprises a profile with tuning features configured for an operating frequency and an operating bandwidth.

14. The spatial power-combining device of claim 1 wherein the output signal conductor comprises a connector for receiving the transmission line.

15. The spatial power-combining device of claim 1 wherein the output ground conductor is a planar structure positioned in a first plane and the output signal conductor is a planar structure positioned is a second plane, and the first plane is parallel to the second plane.

16. The spatial power-combining device of claim 15 wherein the output ground conductor comprises an output ground conductor overlapping portion and an output ground conductor non-overlapping portion, and the output signal conductor comprises an output signal conductor overlapping portion and an output signal conductor non-overlapping portion, wherein a first line perpendicular to the first plane intersects the output ground conductor overlapping portion and the output signal conductor overlapping portion, and no line perpendicular to the first plane can intersect both the output ground conductor non-overlapping portion and the output signal conductor non-overlapping portion.

17. The spatial power-combining device of claim 1 wherein each amplifier assembly comprises a body having a wedge-shaped cross-section, the body forming the output antenna structure.

18. The spatial power-combining device of claim 1 further comprising;
an outer housing, the outer housing comprising the output ground conductor of each amplifier assembly; and
an inner housing, the inner housing comprising the output signal conductor of each amplifier assembly.

19. The spatial power-combining device of claim 18 wherein the outer housing and the output ground conductor of each amplifier assembly are an integral single component.

20. The spatial power-combining device of claim 18 wherein the inner housing and the output signal conductor of each amplifier assembly are an integral single component.

21. A device for modifying a signal, the device comprising:
an amplifier assembly comprising;
an amplifier;
an input antenna structure comprising an input ground conductor and an input signal conductor that are entirely separated by air;
an output antenna structure comprising an output ground conductor and an output signal conductor that are entirely separated by air;
a first transmission line connected between the amplifier and the input signal conductor; and
a second transmission line connected between the amplifier and the output signal conductor.

22. The device of claim 21 wherein the amplifier assembly is configured to transmit amplified electromagnetic signals in a frequency range that includes a frequency between 40 GHz and 400 GHz.

23. The device of claim 21 wherein the input signal conductor comprises a first connector for receiving the first transmission line and the output signal conductor comprises a second connector for receiving the second transmission line.

24. The device of claim 21 further comprising;
an plurality of amplifier assemblies arranged coaxially about a center axis;
an input coaxial waveguide section electrically coupled to the plurality of amplifier assemblies at each input antenna structure; and
an output coaxial waveguide section electrically coupled to the plurality of amplifier assemblies at each output antenna structure.

* * * * *

UNITED STATES PATENT AND TRADEMARK OFFICE
CERTIFICATE OF CORRECTION

PATENT NO. : 10,340,574 B2
APPLICATION NO. : 15/845225
DATED : July 2, 2019
INVENTOR(S) : Ankush Mohan et al.

Page 1 of 1

It is certified that error appears in the above-identified patent and that said Letters Patent is hereby corrected as shown below:

In the Specification

In Column 5, Line 23, replace "the impedance 4" with --the impedance $Z_C$--.

Signed and Sealed this
Twentieth Day of August, 2019

Andrei Iancu
*Director of the United States Patent and Trademark Office*